United States Patent [19] | [11] 4,381,677
Ruesch et al. | [45] May 3, 1983

[54] REACTANCE MEASUREMENT CIRCUIT

[75] Inventors: James R. Ruesch, Boulder, Colo.; Roger L. Frick, Eden Prairie; Earl A. Grindheim, Richfield, both of Minn.

[73] Assignee: Rosemount Inc., Eden Prairie, Minn.

[21] Appl. No.: 227,736

[22] Filed: Jan. 23, 1981

[51] Int. Cl.[3] .................................... G01L 9/12

[52] U.S. Cl. .................................... 73/718; 73/701; 73/724; 331/65

[58] Field of Search ................. 73/701, 718, 724, 716, 73/304 C; 361/283, 284; 324/60 C; 331/65

[56] References Cited

U.S. PATENT DOCUMENTS

| | | | |
|---|---|---|---|
| 3,271,669 | 9/1966 | Lode | 324/60 |
| 3,646,538 | 2/1972 | Frick | 340/200 |
| 3,718,856 | 2/1973 | Hendricks | 324/57 R |
| 3,965,746 | 6/1976 | Rabek | 73/718 |
| 3,975,719 | 8/1976 | Frick | 340/200 |

FOREIGN PATENT DOCUMENTS

| | | |
|---|---|---|
| 2064805 | 3/1970 | France . |
| 977125 | 1/1963 | United Kingdom . |
| 2034051 | 10/1979 | United Kingdom . |

*Primary Examiner*—Donald O. Woodiel
*Attorney, Agent, or Firm*—Kinney, Lange, Braddock, Westman and Fairbairn

[57] ABSTRACT

A circuit for measuring the reactance of an AC reactance sensor which varies responsive to a condition to be sensed, such as pressure, is disclosed. The circuit comprises an oscillator coupled to the sensor for providing a time varying oscillator signal having a variable frequency and a substantially constant peak to peak voltage to the sensor, and a plurality of rectifiers coupled to the oscillator and to the sensor for providing the oscillator signal as a charging signal to the sensor and for providing discharging signals from the sensor, the discharging signals being a function of the reactance of the sensor, and an amplifier coupled to the rectifiers and to the oscillator for providing an input control signal to the oscillator to control the frequency of the oscillator signal as a function of the reactance of the sensor.

33 Claims, 3 Drawing Figures

FIG. 2
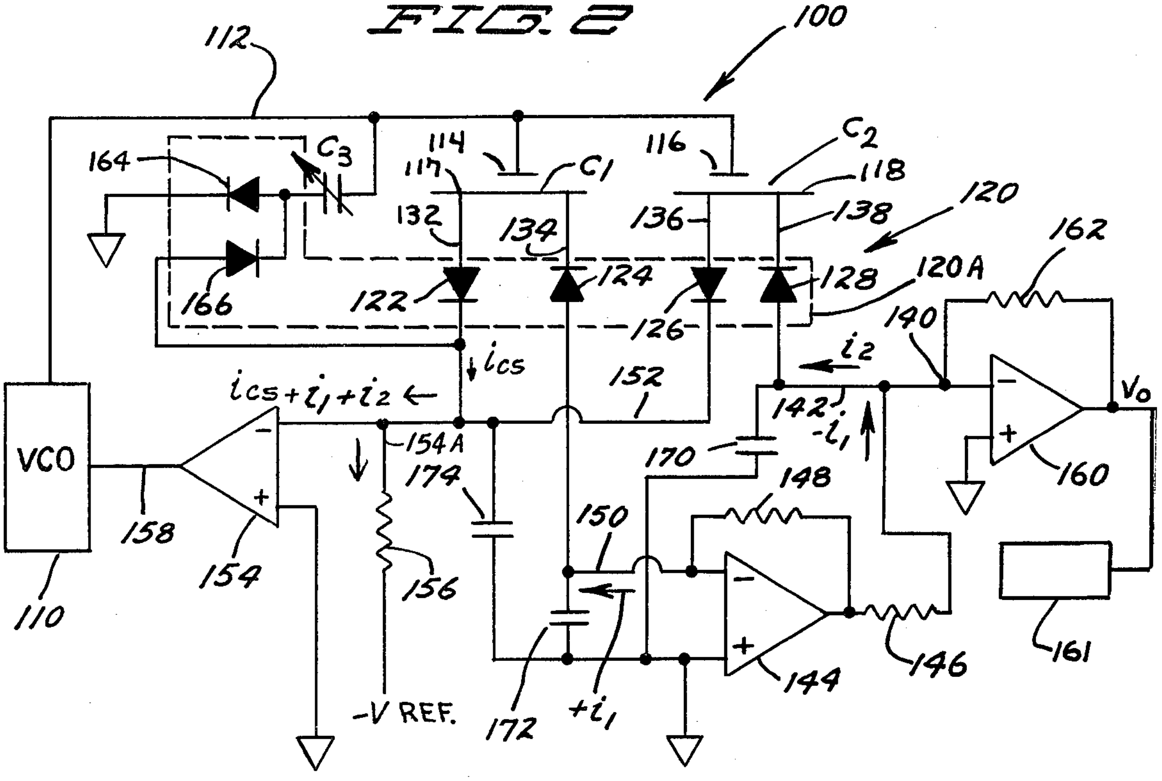
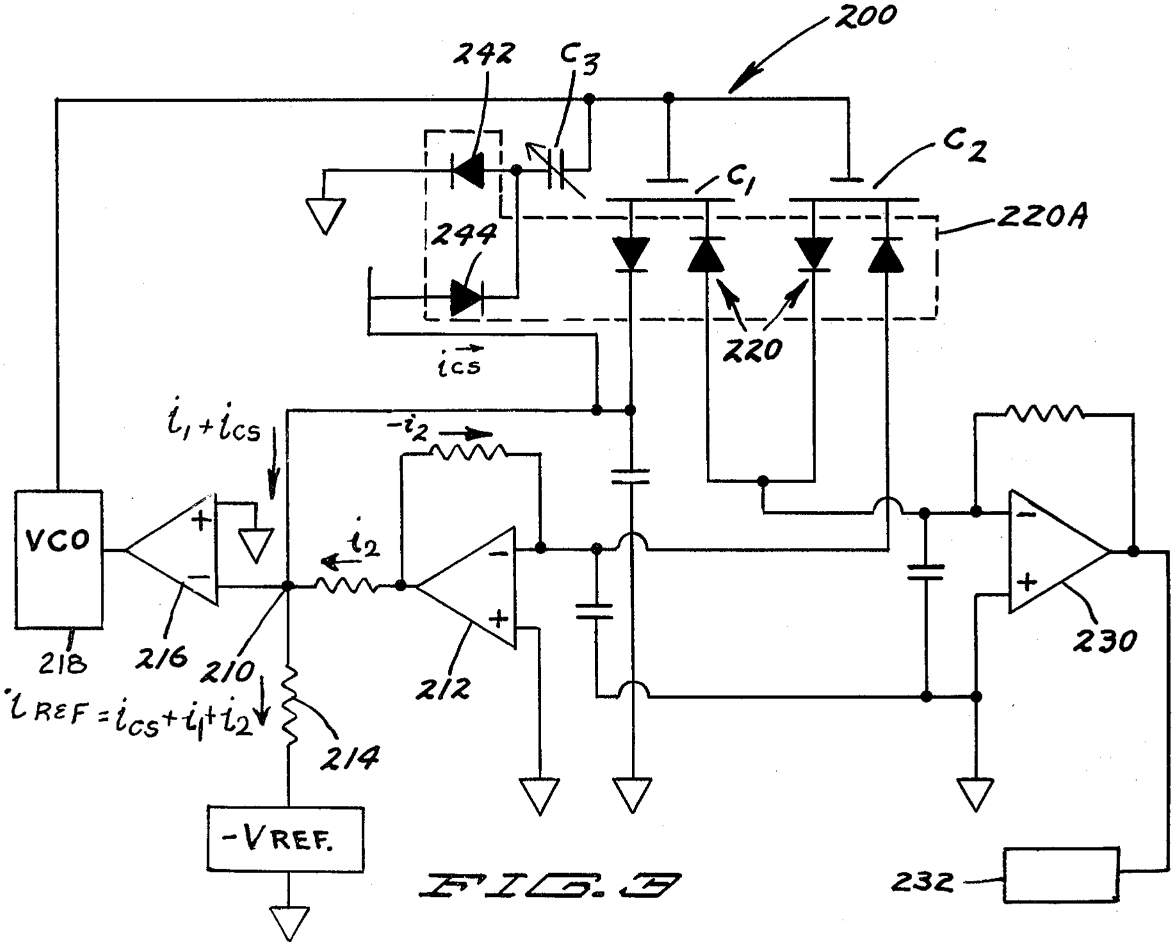
FIG. 3

REACTANCE MEASUREMENT CIRCUIT

BACKGROUND OF THE INVENTION

1. Field of the Invention

This invention relates to AC reactance sensor circuitry and more particularly to capacitance transducers for measuring pressure.

2. Prior Art

In the prior art, various AC reactance measuring schemes are shown. While many such techniques have been successful, a problem of prior art schemes has been that typically the amplitude of the (peak to peak) voltage applied to the sensor circuitry has been the controlled parameter for such circuitry and change in the voltage results in reduced stability of the output signal.

One further significant disadvantage has been the requirement of driving a transformer to provide such peak to peak voltage to a varying reactive load. As known to those skilled in the art, a transformer, though faithful once operable, is more difficult to reliably acquire than resistors, capacitors, or solid state components. Elimination of the transformer results in a reduction of size and power required. A further problem is that such transformers do not lend themselves to use with hybrid circuitry. Such hybrid circuitry with an interactive or capacitive sensor is desirable. Elimination of such transformers results in a functionally improved, lower cost circuit.

SUMMARY OF THE INVENTION

One object of the present invention is to provide an improved AC reactance measuring circuit responsive to a condition to be sensed in which the control parameter is the frequency of a nominally constant peak to peak voltage applied by an oscillator to the AC reactance and which circuit does not require inductive coupling, such as a transformer, from the oscillator to the AC reactance. Non-inductive coupling is facilitated by having the AC reactance electrically isolated (floating) with respect to ground potential. The circuit, according to one embodiment, provides charging pulses to and discharging pulses from an AC reactive sensor, which varies responsive to the parameter to be sensed. The sensor, preferably a cpacitor or a plurality of capacitors, is excited by the oscillator through a rectification means. In one preferred embodiment, when the rectification means comprises a plurality of diodes, the rectification means is improved by having low voltage diodes, proximately located to each other.

The oscillator provides to the combination of the sensor and the rectification means associated with the sensor a nominally constant peak amplitude, time varying oscillator signal, the frequency of which is controlled responsive to the changes in sensor capacitance. Frequency control results in improved functional and cost performance. The advantages of the application of the same peak to peak voltage to the combination of the sensor and the rectification means is readily apparent as unwanted effects, which are not representative of the measured parameter, may then be improved by circuit component selection and arrangement. When a plurality of sensors and rectifiers are desired, they are subjected to the same drive voltage. A further advantage is that the same reference voltage is applied to amplifiers where sensor currents are combined. Additional advantages are apparent from the descriptions of the preferred embodiments.

BRIEF DESCRIPTION OF THE DRAWINGS

FIG. 2 is a schematic representation of another embodiment of the present invention.

FIG. 3 is yet another schematic representation of a further embodiment according to the present invention.

DESCRIPTION OF THE PREFERRED EMBODIMENTS

Description of Circuit of FIG. 1

Figure 1:
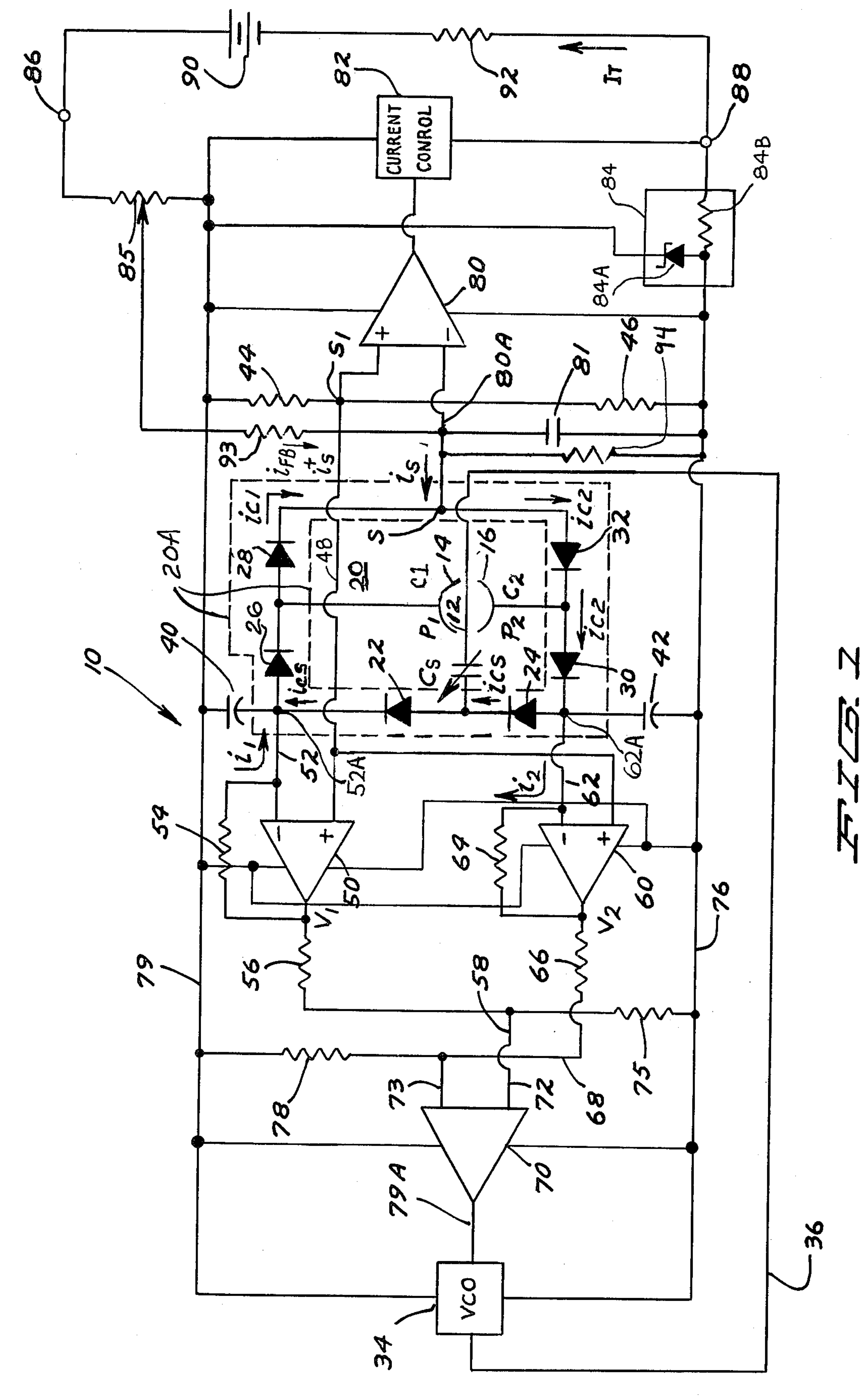
FIG. 1 is a schematic representation of a circuit according to the present invention.

FIG. 1 is a schematic diagram of a circuit embodiment of the present invention shown generally at 10, which preferably is used in conjunction with an AC reactance type differential pressure sensor cell, and, which preferably has a pair of variable capacitors $C_1$ and $C_2$. Stray cell capacitance is compensated for by an adjustable capacitor $C_s$. While two variable capacitors $C_1$ and $C_2$ are shown in FIG. 1, it is to be understood that for certain applications of the circuit, the AC reactance means may, as desired, be one active capacitor; for other applications, additional active capacitors, or inductors or other AC reactance means can be used. In addition to being particularly useful as a circuit for a capacitance pressure sensor, this circuit embodiment shows conversion of the capacitance signal to control the direct current in a two wire current loop, having an external power supply and load, whereby such direct current is a function of the sensed parameter.

In one preferred embodiment, capacitors $C_1$ and $C_2$ are formed in a chamber having a common capacitor plate 12 which comprises a diaphragm which is at least partially electrically conductive disposed therein. At least portions of the chamber walls facing plate 12 are electrically conductive and these wall portions form second plates 14 and 16 for capacitors $C_1$ and $C_2$, respectively. Preferably plate 12 is electrically isolated (floating) from the transducer housing to eliminate the requirement of inductive couplings, such as a transformer, from a drive oscillator to plate 12. Second plates 14 and 16 preferably are also electrically isolated (floating) from the transducer housing. When the condition to be measured is differential pressure, a first pressure $P_1$ is applied to one side of plate 12, and a second pressure $P_2$ is applied to a second side of plate 12. Plate 12 is then urged towards second plate 14 or second plate 16 dependent on whether $P_2$ is greater than, or less than, $P_1$. Movement of plate 12 changes the spacing between plate 12 and second plates 14 and 16 which results in a change of the capacitance of $C_1$ and $C_2$. Such sensor configuration and operation is fully described in copending U.S. patent application entitled Capacitive Pressure Transducer with Isolated Sensing Diaphragm, Ser. No. 194,758, filed Oct. 6, 1980 held by the same assignee as the present invention.

A rectification means for rectifying signals to and from capacitors $C_1$, $C_2$ and $C_s$ is shown generally at 20, and includes diodes 22 and 24 for capacitor $C_s$, detector diodes 26 and 28 for $C_1$ and detector diodes 30 and 32 for $C_2$ all of which diodes are serially connected in a forward conducting closed loop. Second plate 14 of $C_1$ is connected between diodes 26 and 28; second plate 16 of $C_2$ is connected between diodes 30 and 32; and capacitor ($C_s$) is connected between diodes 22 and 24. Circuit performance is improved when rectification means 20 such as diodes 22, 24, 26, 28, 30 and 32 are at substantially the same temperature, which substantially eliminates thermal drift problems. Such thermal stability may be obtained by hybrid mounting of rectification means 20, or mounting rectification means 20 on a single substrate, or other proximate mounting technique, as desired. In FIG. 1 such proximate mounting is shown by the dotted lines 20A enclosing rectification means 20. Diodes 22, 24, 26, 28, 30 and 32 preferably have a low forward conducting voltage drop characteristic.

A voltage controlled oscillator 34 is coupled to plate 12 by a line 36 to supply a nominally constant peak to peak voltage at a controlled frequency to plate 12. Capacitors 40 and 42 are coupled to rectification means 20 to smooth current signals which are responsive to capacitors $C_1$ and $C_2$ as driven by oscillator 34. Resistors 44 and 46 form a voltage divider across power lines 79 and 76, which are powered by the output voltage of a voltage regulator 84, thus, the voltage divider provides a circuit reference signal at node $S_1$. A line 48 couples the non-inverting inputs of operational amplifiers 50 and 60 to the voltage divider to receive such reference signal. One input of an output amplifier 80 is also coupled by line 48 to receive such reference signal from $S_1$.

The inverting input of amplifier 50 is coupled to second plate 14 of $C_1$ through line 52, a current summing node 52A, and diode 26, and is coupled to plate 12 (the other side of $C_1$) and to $C_s$ through diode 22. Line 52 is also connected to capacitor 40 between diodes 26 and 22. The current representative of $C_1$ ($i_{C1}$) and current representative of $C_s$ ($i_{Cs}$) combine at node 52A and the resultant current is $i_1$. Similarly, the inverting input of amplifier 60 is coupled to second plate 16 of $C_2$ by a line 62, a current summing node 62A, through diode 30 and is coupled to plate 12 (the other side of $C_2$) and to $C_s$ through diode 24. Line 62 is connected to capacitor 42 between diodes 30 and 24. The current representative of $C_2$ ($i_{C2}$) and the current representative of $C_s$ ($i_{Cs}$) combine at node 62A and the resultant current is $i_2$. Resistors 54 and 64 provide feedback to the inverting inputs of amplifiers 50 and 60, respectively.

A first input 72 of an amplifier 70 is coupled to the output of amplifier 50 through a resistor 56 and a line 58, and a second input 73 of amplifier 70 is coupled to the output of amplifier 60 through resistor 66 and a line 68. First input 72 is also coupled through line 58 and a resistor 75 to power line 76. Second input 73 is coupled through line 68 and a resistor 78 to power line 79. Amplifier 70 functions as a differential amplifier, comparing the signals at its inputs (72 and 73) and providing an output representative of such comparison on a line 79A to control oscillator 34. Oscillator 34 is powered through lines 76 and 79.

A summing point S for circuit 10 is between diode 28 and diode 32 and is coupled to the inverting input of amplifier 80 by a line 80A. A capacitor 81 is coupled from line 80A to line 76 to filter the current signals. Amplifier 80 preferably is coupled to current control 82 but may be coupled directly to suitable implementation or readout means. Current control 82 is also connected to line 79 and to terminal 88. Amplifiers 50, 60, 70 and 80 are powered through lines 79 and 76. Circuit 10 is supplied a regulated voltage through voltage regulator 84. Regulator 84 is, for example, a zener diode 84A connected from lines 79 to 76 with a resistor 84B connected to line 76 and to terminal 88. Voltage controlled oscillator 34 is coupled to voltage regulator 84 by power lines 79 and 76 for supply of the substantially constant (regulated) voltage. Circuit 10 preferably is also coupled to a two wire current loop through a feedback resistor which may be a potentiometer as shown schematically at 85, coupled to the two terminals 86 and 88. In this embodiment, a wiper of potentiometer 85 couples a small but known feedback current ($i_{FB}+i_s$) which is a portion of the total two wire current ($I_T$) through resistor 93 to sum point S. Resistor 94 sinks a constant portion of a feedback current ($i_{FB}$). A variable portion of the feedback current ($i_s$) is summed at sum point S with $i_{C1}$ and $i_{C2}$. The combination of currents ($i_{C1}$, $i_{C2}$ and $i_s$) at S affects the inverting input of amplifier 80 through line 80A. Line 76 is coupled to the voltage regulator 84 to terminal 88. The two wire current loop is completed through an external supply 90 and series connected load 92 coupled to terminals 86 and 88.

Operation of the Circuit of FIG. 1

The embodiment of FIG. 1 employs three capacitors $C_1$, $C_2$ and $C_s$ with a known diode detection scheme. While the concept of a controlled product oscillator is known, conventional oscillators for capacitance measurement vary the peak to peak voltage ($V_{pp}$) and incidently frequency (f) to obtain the desired controlled product (P), so that $P \propto (fV_{pp})$.

In the circuit of the present invention, the amplitude of the voltage ($V_{pp}$) is held to be substantially constant while the frequency (f) is varied to obtain the desired controlled product (P). This method of varying frequency to obtain the desired control is effective since the portion of rectification means 20 associated with $C_1$ (diodes 26 and 28) is referenced to the same peak to peak voltage as the portion of rectification means 20 associated with $C_2$ (diodes 30 and 32). (Line 36 applies the same voltage ($V_{pp}$) to each of the capacitors $C_1$, $C_2$ and $C_s$.) For example, when voltage on line 36 is positive with respect to line 48 (during a first portion of each cycle of oscillator 34), $C_1$, $C_2$ and $C_s$ are charged positively, and when the voltage on line 36 is negative with respect to line 48 (during a second portion of the cycle of oscillator 34) $C_1$, $C_2$ and $C_s$ are charged negatively. During a first portion of a cycle of oscillator 34, $C_1$ charges positively through line 76, capacitor 81, diode 28 to second plate 14 which in conjunction with plate 12 forms $C_1$ which is connected to oscillator 34 by line 36. During the same first portion of a cycle of oscillator 34, $C_2$ charges positively through line 76, capacitor 42, diode 30 to third plate 16 which in conjunction with first plate 12 comprises $C_2$ which is connected to oscillator 34 by line 36. During a second portion of a cycle of oscillator 34, $C_1$ charges negatively through line 76, Zener diode 84A, line 79, capacitor 40, diode 26 to second plate 14 of $C_1$ and thence on plate 12 to oscillator 34 on line 36. During the same second portion of a cycle of oscillator 34, $C_2$ charges negatively through line 76, capacitor 81, diode 32 to second plate 16 of $C_2$ and thence on plate 12 to oscillator 34 on line 36. One terminal of $C_s$, connected through plate 12, is connected directly to oscillator 34 by line 36. $C_s$ charges positively on a first portion of a cycle of oscillator 34 through line 76, Zener diode 84A, line 79, capacitor 40, and diode 22. $C_s$ charges negatively on a second portion of a cycle of oscillator 34 through line 76, capacitor 42, and diode 24. The magnitudes of currents $i_{C1}$ and $i_{c2}$ are functions of capacitance of $C_1$ and $C_2$. When a differential pressure sensor is used (as shown in FIG. 1) capacitances $C_1$ and $C_2$ are a function of the differential pressure ($P_1-P_2$).

Currents $i_{C1}$ and $i_{C2}$ are smoothed by capacitors 40 and 42 and each combines with $i_{Cs}$; the resultant currents, $i_1$ and $i_2$ respectively, are also connected to the inverting inputs of amplifiers 50 and 60, which convert $i_1$ and $i_2$ to proportional voltage outputs $V_1$ and $V_2$ respectively. The voltage outputs $V_1$ and $V_2$ are coupled to the inputs 72 and 73 of amplifier 70. The output of amplifier 70, which therefore varies in proportion to the difference of $i_1$ and $i_2$, drives oscillator 34 to provide the voltage peak to peak ($V_{pp}$) which has a frequency which satisfies the control equation such that:

$$V_1=i_1R_{54}=f(V_{pp}-2V_D)(C_1-C_s)R_{54} \quad \text{Equation (1)}$$

$$-V_2=i_2R_{64}=f(V_{pp}-2V_D)(C_2-C_s)R_{64} \quad \text{Equation (2)}$$

Where:

$V_1$=output voltage of amplifier 50
$V_2$=output voltage of amplifier 60
f=frequency of oscillator 34
$V_{pp}$=amplitude of the voltage peak to peak from oscillator 34
$C_1$=capacitance of $C_1$
$C_2$=capacitance of $C_2$
$C_s$=capacitance of $C_s$
$R_{54}=R_{64}$
$V_D$=voltage drop of the respective diode Subtracting Equation (1) from Equation (2) and setting $V_1-V_2=K$, it is seen that amplifier 70 provides closed loop control of frequency responsive to a change in capacitance for oscillator 34 such that:

$$P=\frac{K}{(C_1+C_2-2C_s)R_{54}} \quad \text{Equation (3)}$$

Where:

P=the controlled product−f($V_{pp}$)
K=a constant, $V_1-V_2$

It is noted that since oscillator 34 is inside of the control loop (between the circuit nodes 52A and 62A) the frequency of $V_{pp}$ therefrom need not be linear with respect to the output of amplifier 70.

Oscillator 34 in one embodiment is the voltage controlled oscillator of the phase locked loop circuit of a CMOS 4046 as manufactured by Radio Corporation of America (RCA), National Semiconductor or Motorola.

Amplifier 80 provides an output signal responsive to the currents $i_{C1}$ and $i_{C2}$ which flow to sum point S and summing the currents at S yields:

$$i_{C1}-i_{C2}=i_s \quad \text{Equation (4)}$$

Since amplifier 80 amplifies $i_s$ via current control 82, loop current sensing resistor 85, and feedback resistor 93 to give a proportional current signal in load resistor 92 and by substituting Equation (3) into Equation (4) it is seen that the two wire current ($I_T$) is a function of the linearized differential pressure signal; that is:

$$I_T \propto i_s=\left(\frac{C_2-C_1}{C_1+C_2-2C_s}\right)\frac{K}{R_{54}} \quad \text{Equation (5)}$$

The output signal from amplifier 80, as shown, preferably drives a current control 82 for a two wire circuit, having an external power supply 90 and a series coupled load 92 connected to terminals 86 and 88 by means of a conventional two wire circuit. The total DC current $I_T$ in the two wire circuit then is a function of the capacitances $C_1$ and $C_2$ and the measured parameter.

Currents $i_{C1}$ and $i_{C2}$ are a function of the peak to peak voltage ($V_{pp}$) applied, the respective diode drops ($V_{d26}$ and $V_{d28}$) or ($V_{d30}$ and $V_{d32}$), the voltage drops ($V_a$) between the diodes and the current summing nodes (52A, 62A and point S) which may be represented as $fV_{pp}CR$, where C is the sensor capacitance and R is the circuit resistance, and the losses caused by referencing the current $i_{C1}$ and $i_{C2}$ to different reference voltages ($\Delta V_b$).

From the foregoing:
Generally, $$i_C=f(V_{pp}-V_{d1}-V_{d2}-V_a-\Delta V_b)C$$

and, $$i_{C1}=f(V_{pp}-V_{d26}-V_{d28}-fV_{pp}C_1R-\Delta V_b)C_1$$

$$i_{C2}=f(V_{pp}-V_{d30}-V_{d32}-fV_{pp}C_2R-\Delta V_b)C_2$$

From these equations, it is observed that for $i_{C1}$ and $i_{C2}$ to be representative of a condition to be measured, the terms within the parenthesis, i.e. $(V_{pp}-V_{d1}-V_{d2}-V_a-\Delta V_b)$ must be quite stable. Therefore maximizing the amplitude of $V_{pp}$ and controlling frequency not amplitude of $V_{pp}$, provides maximum amplitude irrespective of the changes of $C_1$ and $C_2$. Controlling the changes in $V_{d1}$ and $V_{d2}$ to be substantially the same and minimizing the remaining terms $V_a$ and $\Delta V_b$ also enhances stability and results in improved current signals $i_{C1}$ and $i_{C2}$ by reducing unwanted errors. Thus, one important advantage of the present invention is providing a substantially constant peak to peak voltage ($V_{pp}$) to fully charge the capacitors while varying the frequency of $V_{pp}$ responsive to the change in capacitance. It is observed that the frequency variation is controlled within limits so that the respective capacitors $C_1$, $C_2$ and $C_s$ may be fully charged and fully discharged during each cycle. Means for improving the uniformity of the diode drops by proximate mounting is hereinabove disclosed. The effect of voltage drops ($V_a$) is improved as there is no voltage drop between rectification means 20 and the current summing nodes i.e. 52A, 62A, sum point S. Finally, circuit current summing nodes, such as nodes 52A, 62A and sum point S are referenced to the same reference voltage by amplifiers 50, 60 and 80 respectively, thus minimizing $\Delta V_b$. In summation then, $V_{pp}$ is maximized and the other terms are optimized, thus resulting in an enhanced signal to amplifier 80 and an enhanced output signal to current control 82 which results in an improved two wire current ($I_T$).

Description of the Circuit of FIG. 2

A circuit for measuring variable capacitance is shown generally at 100. In this embodiment, two variable, capacitors $C_1$ and $C_2$ are shown, but again, a different quantity of capacitors may be used, as desired. A voltage controlled oscillator 110 is coupled to first plates 114 and 116 of $C_1$ and $C_2$ respectively through a line 112. The second plates 117 and 118 of $C_1$ and $C_2$ are coupled to rectification means 120 comprising diodes 122, 124, 126 and 128 (which preferably are proximately located together for thermal stability as indicated by line, 120A) by lines 132, 134, 136 and 138, respectively. The anode of diode 128 is coupled to a current summing node 140 by a line 142. The output of a current inverting amplifier 144 is also coupled to node 140 through a resistor 146 and line 142. Amplifier 144 has a feedback resistor 148 coupled from its inverting input to its output and has its non-inverting input coupled to circuit common. The inverting input of amplifier 144 is coupled through a line 150 to the anode of diode 124 and in turn to second plate 117 of $C_1$.

Diodes 122 and 126 are each coupled by a line 152 to the inverting input of a control amplifier 154 and to a current summing node 154A. A reference current is provided from a reference voltage $-V_{REF}$ through a resistor 156. A second input of amplifier 154 is completed to circuit common. The output of amplifier 154 provides the control signal for oscillator 110 through line 158.

An amplifier 160 has its inverting input coupled to node 140 and a feedback resistor 162 which is coupled from the inverting input to the output of amplifier 160. The non-inverting input of amplifier 160 is coupled to circuit common. Amplifier 160 provides an output signal ($V_o$) from circuit 100 which is a function of $C_1$ and $C_2$, which output preferably is used in conjunction with a suitable implementation or readout means 161, a current control for a two wire transmitter, a current to pressure converter or the like. Linearization for $C_1$ and $C_2$ is provided by adjustable capacitor $C_3$ coupled to line 112 and to circuit common through diode 164 and to line 152 through diode 166. Diodes 164 and 166 may be included in rectification means 120. Since, in this case, only diode 166 of the pair consisting of 164 and 166 are coupled to summing node 154A, the value of capacitor $C_3$ must be doubled so that $C_3=2C_s$, hence:

Equation (6)

$$V_o = K\left(\frac{C_2 - C_1}{C_1 + C_2 - (2C_s)}\right)$$

Filter capacitors 170, 172 and 174 from lines 142, 150 and 152 to circuit common provide for smoothing the current signals.

Operation of the Circuit of FIG. 2

In operation, oscillator 110 provides a substantially constant amplitude peak to peak voltage at a controlled, varied frequency to each of the capacitors $C_1$, $C_2$ and $C_3$. Second plates (117,118) of $C_1$ and $C_2$ are coupled through rectification means 120 to amplifiers 144, 154 and 160.

During a first portion of the cycle of oscillator 110, a first current $i_1$ representative of the capacitance of capacitor $C_1$, flows from the current summing node at the inverting input of amplifier 144 through line 150, and diode 124 and line 134 to charge $C_1$. During a second portion of the cycle of oscillator 110, current $i_1$ flows from $C_1$, through line 132, diode 122 and line 152 to the current summing node 154A (which affects the input of amplifier 154) and through resistor 156 to $-V_{REF}$. This first current path is completed by feedback resistor 148, which, in cooperation with inverter amplifier 144 and resistor 146, inverts first current $i_1$, so that along line 142, a current ($-i_1$) is present at node 140. During the first portion of the cycle of oscillator 110, a second current ($i_2$), which is representative of the capacitance of $C_2$, flows from node 140 through line 142 and diode 128 to line 138 to charge $C_2$. During a second portion of the cycle of oscillator 110, $i_2$ flows through line 136 and diode 126 to line 152 and to the summing node 154A (which affects the inverting input of amplifier 154) and through resistor 156 to $-V_{REF}$. In control, amplifier 154 provides a voltage signal at its output which controls the frequency of oscillator 110 such that the sum of current $i_1$ and current $i_2$ is a function of the nominally constant voltage peak to peak ($V_{pp}$), and diode drop ($V_D$) and the frequency (f) of oscillator 110 and $C_1$ and $C_2$, that is:

$$i_1+i_2 \propto f(V_{pp}-2V_D)(C_1+C_2) \propto P$$

Description and Operation of the Circuit of FIG. 3

Yet a further embodiment of the circuitry according to the present invention is shown at 200 in FIG. 3. In this embodiment, a current summing node 210 is fed a first current $i_1$ responsive of the capacitance of capacitor $C_1$, a second current $i_2$ responsive of the capacitance of capacitor $C_2$ from current inverting amplifier 212. In this embodiment, control amplifier 216 has its non-inverting input coupled to circuit common and its inverting input coupled to summing node 210 and produces an output signal to control the frequency of voltage controlled oscillator 218. The rectification means shown generally at 220 rectifies the currents $i_1$ and $i_2$, representative of $C_1$ and $C_2$ which result from the repetitive charging and discharging substantially constant amplitude, variable frequency voltage signals ($V_{pp}$) from oscillator 218 which frequency is controlled responsive to the changes of the capacitance of $C_1$ and $C_2$. An output amplifier 230 is coupled at its inverting input to rectification means 220 and provides an output signal to a suitable implementation means 232, such as a two wire current control, readout device or the like. Linearization for $C_1$ and $C_2$ is provided for by adjustable capacitor $C_3$ through diodes 242 and 244, which are coupled to summing node 210. Diodes 242 and 244 may be included in rectification means 220A. Since, in this case as in one embodiment of FIG. 2, only diode 244 is coupled to the summing node 210 the value of $C_3$ must be doubled as explained in relation to Equation (6) above.

The embodiments of FIGS. 2 and 3 function using a substantially constant amplitude peak to peak voltage having a variable frequency to excite the reactance means without an inductive coupling means to couple the peak to peak voltage to such reactive means. These embodiments when used with a two wire circuit can use the inverting input to amplifiers 160 and 230 respectively as the summing node for the feedback current ($i_s$), and currents $i_1$ and $i_2$. The current control, voltage regulator and other circuitry as shown in FIG. 1 or other such two wire circuitry may then be used. When the two wire circuitry of FIG. 1 is used and when other two wire circuitry is used, again the amplifiers may receive their power through the two wire terminals. The advantages of FIG. 1 are present in the embodiments of FIGS. 2 and 3.

Those skilled in the art understand that a variable impedance is comprised in a variable AC reactance means.

The instant invention has been described by reference to several preferred embodiments, those skilled in the art recognize that various changes in form and detail may be made without departing from the spirit or scope of the invention.

What is claimed is:

1. A circuit for measuring the reactance of an AC reactance means which varies responsive to a condition to be sensed, the circuit comprising:

oscillator means coupled to the AC reactance means for providing a time varying oscillator signal having a variable frequency and a substantially constant peak to peak voltage to the AC reactance means;

rectification means coupled to the oscillator means and to the reactance means for providing charging signals to and discharging signals from the AC reactance means, the charging and discharging signals being a function of the reactance of the AC reactance means; and control means coupled to the rectification means and to the oscillator means for providing an input control signal to the oscillator means to control the variable frequency thereof thus adjusting the charging and discharging signals as a function of the reactance of the AC reactance means.

2. The circuit of claim 1 wherein the oscillator means is non-inductively coupled to the AC reactance means.

3. The circuit of claim 2 wherein the AC reactance means comprises at least one varying capacitor.

4. The circuit of claim 3 wherein the AC reactance means comprises capacitance sensor means which changes responsive to a change in pressure.

5. The circuit of claim 2 wherein the AC reactance means comprises at least a first and a second reactance means responsive to pressure at least one of which is variable.

6. The circuit of claim 4 wherein the capacitance sensor means is enclosed in a transducer housing and wherein the capacitance sensor means is electrically isolated from the transducer housing.

7. The circuit of claim 5 wherein the control means comprises first amplifier means having input and output terminals for converting discharging signals from the first and second reactance means at its input terminals to voltage signals at its output terminal.

8. The circuit of claim 5 wherein the control means comprises first and second amplifier means having input and output terminals and whereby the first amplifier means and the second amplifier means are responsive to at least first and second reactance means signals at their respective input terminals to provide signals representative thereof at their respective output terminals.

9. The circuit of claim 8 wherein the control means further comprises comparator means having input terminals for receiving the signals from the first and second amplifier means and having an output terminal for providing the input control signal at its output terminal as a function of the signals at its input terminals.

10. The circuit of claim 5 and further comprising:

a summing point coupled to the rectifier means to arithmetically sum the discharging signals from the AC reactance means.

11. The circuit of claim 10 and further comprising:

output means coupled to the sum point to provide an output signal representative of the reactance of the variable AC reactance means to a suitable utilization device.

12. The circuit of claim 11 and further comprising:

current control means coupled to the output means for controlling the current in a two wire circuit as a function of the output signal.

13. The circuit of claim 12 wherein the two wire circuit includes a voltage regulator and two terminals, the two terminals adapted to be connected by a pair of wires to an external supply and series connected load; wherein the voltage regulator and the current control means are connected between the two terminals; wherein a DC current in the two wire circuit is controlled by the current control means and wherein the voltage regulator provides a stable voltage reference for the circuit.

14. The circuit of claim 13 further comprising voltage reference means coupled to the voltage regulator to provide a reference voltage to the control means.

15. The circuit of claim 14 wherein the output means is coupled to the reference voltage means.

16. The circuit of claim 13 wherein the sum point and the input terminals of the first and second amplifier means are referenced to the reference voltage.

17. The circuit of claim 5 and further comprising:

a sum point coupled to the control means for arithmetically combining the discharging signals from the first and second reactance means.

18. The circuit of claim 17 and further comprising:

signal inverter means coupled to the sum point and to the rectification means for inverting at least one signal current from the variable AC reactance means for arithmetic combination with at least one other signal current from the variable AC reactance means.

19. A two wire current transmitter for measuring the capacitance of a capacitive sensor means having at least two plates which capacitance varies as a function of a parameter to be sensed and for providing a DC signal representative of the parameter to be sensed, the transmitter comprising:

transformerless oscillator means for providing a time varying oscillator signal for exciting the sensor means to produce a sensor signal representative of the parameter to be sensed;

rectification means coupled to the sensor means and to the oscillator means to supply the oscillator signal to the sensor means and to rectify the sensor signal;

control means coupled to the rectification means having an input terminal means for receiving the rectified sensor signal and having an output terminal means coupled to the oscillator means for controlling the frequency of the oscillator signal as a function of the rectified sensor signal; and a pair of terminals for connection to an external power supply and series connected load by means of two wires to power the oscillator means and the control means and to carry the DC signal representative of the parameter.

20. The circuit of claim 19 further comprising second control means coupled to the sensor means and to the rectification means for providing the DC signal as an output signal through the two wires to the external power supply and series connected load which is representative of the rectified sensor signal.

21. The circuit of claim 20 wherein the second control means has input terminals coupled to the rectification means and further comprising a feedback resistor means having a feedback current therethrough coupled to the two wires and to the input of the second control means to provide an input signal to the input terminal for the second control means as a function of the rectified sensor signal and the feedback current.

22. The transmitter of claim 19 wherein the sensor means comprises:

a sensor housing having a chamber;

a common plate formed from a diaphragm in the chamber; and a second plate at least partially formed from a diaphragm facing wall of the chamber.

23. The transmitter of claim 22 wherein the sensor means comprises at least two sensor capacitors which change as a function of a differential pressure on opposite sides of the diaphragm.

24. The transmitter of claim 23 wherein the sensor capacitors are electrically isolated from the sensor housing.

25. In a two wire transmitter having capacitive sensor means for sensing a parameter, the improvement comprising:

transformerless voltage controlled oscillator means for providing a time varying peak to peak voltage oscillator signal having a frequency controlled by a control signal;

rectification means coupled to the sensor means and to the oscillator means for applying the oscillator signal to excite the sensor means and for providing a DC current path from the sensor means for a sensor current responsive to a change in capacitance as a function of the sensed parameter;

control means having an input coupled to the rectification means to receive the sensor current and an output for providing the control signal to the voltage controlled oscillator means as a function of the sensor current to control frequency of the oscillator signal; and current control means responsive to the sensor current and including means for providing a feedback signal for controlling total current in the two wire transmitter as a function of the sensed parameter.

26. The circuit of claim 25 further comprising means coupled to the rectification means and to the oscillator means to maintain the peak to peak voltage at a substantially constant level.

27. A transmitter of claim 25 wherein the sensor means has first and second capacitances ($C_1$ and $C_2$) which vary as a function of the sensed parameter (P), and wherein the control means controls the frequency (f) of the oscillator signal such that:

$$f \propto \frac{P}{V_{pp}(C_1 + C_2)}$$

wherein $V_{pp}$ is the peak to peak voltage of the oscillator signal.

28. A two wire transmitter having a pair of terminals for connection by means of two wires to an external supply and series connected load so that a total two wire current from the transmitter flows through the two terminals and the two wires, the two wire transmitter comprising:

voltage regulator means powered through the two terminals to provide the transmitter with a regulated voltage;

feedback means coupled to the two terminals to provide a feedback signal as a function of the total two wire current;

variable AC reactance means having a reactance which changes as a function of changes in a parameter to be measured;

transformerless oscillator means powered by the voltage regulator means for providing a variable frequency oscillator signal;

rectification means coupled to the oscillator means and the variable AC reactance means to apply the oscillator signal to the variable AC reactance means and to rectify an output signal therefrom, such that the output signal is representative of the parameter to be measured;

control means coupled to the rectification means for receiving the output signal and for providing an oscillator control signal to the oscillator means to control frequency of the oscillator signal as a function of the parameter to be sensed;

means for providing a current control signal as a function of the output signal and the feedback signal; and current control means coupled to the two terminals and the feedback means for controlling total two wire current as a function of the current control signal.

29. A circuit for measuring reactance of AC reactance means, the circuit comprising:

oscillator means for providing a constant amplitude time varying oscillator signal having a frequency which is a function of a control signal;

coupling means coupled to the oscillator means and to the reactance means to apply the oscillator signal to the AC reactance means;

rectification means coupled to the variable AC reactance means to provide a DC current path for a signal from the variable AC reactance means;

control means coupled to the rectification means for providing the control signal as a function of the signal from the variable AC reactance means;

output means coupled to the rectification means for providing an output signal which is a function of the reactance of the variable AC reactance means;

means to couple said circuit to a pair of wires in turn connectable to a power source and load; and current control means coupled to the output means for controlling the total current in the pair of wires as a function of the output signal.

30. A circuit according to claims 1, 2, 19, 25 or 28 wherein the rectification means is proximately formed to substantially eliminate thermal drift problems therebetween.

31. The circuit of claim 2 wherein the rectification means comprises a plurality of diodes.

32. The circuit of claim 2 wherein the rectification means comprises a plurality of proximately supported diodes.

33. The circuit of claim 2 wherein the rectification means comprises a plurality of diodes, which are substantially compensated for thermal drift.

* * * * *